(12) United States Patent
Mann et al.

(10) Patent No.: US 8,873,122 B2
(45) Date of Patent: Oct. 28, 2014

(54) MICROLITHOGRAPHIC IMAGING OPTICAL SYSTEM INCLUDING MULTIPLE MIRRORS

(75) Inventors: Hans-Juergen Mann, Oberkochen (DE); Armin Schoeppach, Aalen (DE); Johannes Zellner, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 336 days.

(21) Appl. No.: 13/031,920

(22) Filed: Feb. 22, 2011

(65) Prior Publication Data

US 2011/0165522 A1 Jul. 7, 2011

Related U.S. Application Data

(63) Continuation of application No. PCT/EP2009/006171, filed on Aug. 26, 2009.

(60) Provisional application No. 61/095,689, filed on Sep. 10, 2008.

(30) Foreign Application Priority Data

Sep. 10, 2008 (DE) .......................... 10 2008 046 699

(51) Int. Cl.
*G02B 26/08* (2006.01)
*G02B 26/10* (2006.01)
*G02B 26/12* (2006.01)
*G03F 7/20* (2006.01)
*G02B 17/06* (2006.01)
*G02B 26/06* (2006.01)

(52) U.S. Cl.
CPC ........ *G02B 17/0657* (2013.01); *G03F 7/70266* (2013.01); *G02B 26/06* (2013.01); *G03F 7/70233* (2013.01)
USPC ........................................ 359/201.2; 359/859

(58) Field of Classification Search
USPC ......... 359/838, 850, 857, 859, 861, 864, 865, 359/866; 355/67, 71; 378/34, 35
See application file for complete search history.

(56) References Cited

U.S. PATENT DOCUMENTS 6,172,825 B1 1/2001 Takahashi
6,292,309 B1 9/2001 Sekita et al.
(Continued)

FOREIGN PATENT DOCUMENTS

CN 101088039 A 12/2007
EP 1 093 021 A2 4/2001
(Continued)

OTHER PUBLICATIONS

International Search Report for the corresponding PCT Application No. PCT/EP2009/006171, filed Feb. 8, 2010.
(Continued)

*Primary Examiner* — Stephone B Allen
*Assistant Examiner* — Tamara Y Washington
(74) *Attorney, Agent, or Firm* — Fish & Richardson P.C.

(57) ABSTRACT

An imaging optical system includes a plurality of mirrors configured to image an object field in an object plane of the imaging optical system into an image field in an image plane of the imaging optical system. An illumination system includes such an imaging optical system. The transmission losses of the illumination system are relatively low.

23 Claims, 3 Drawing Sheets

(56) References Cited

U.S. PATENT DOCUMENTS

| | | |
|---|---|---|
| 6,970,286 B1 | 11/2005 | Kunick |
| 7,186,983 B2 | 3/2007 | Mann et al. |
| 7,443,619 B2 | 10/2008 | Sakino et al. |
| 7,869,122 B2 * | 1/2011 | Shafer et al. ............ 359/365 |
| 2002/0176063 A1 | 11/2002 | Omura |
| 2004/0114217 A1 | 6/2004 | Mann et al. |
| 2007/0035814 A1 | 2/2007 | Dinger et al. |
| 2007/0058269 A1 | 3/2007 | Mann et al. |
| 2007/0233112 A1 | 10/2007 | Orbay et al. |
| 2008/0170310 A1 | 7/2008 | Mann |
| 2009/0040493 A1 * | 2/2009 | Komatsuda ............ 355/67 |

FOREIGN PATENT DOCUMENTS

| | | |
|---|---|---|
| EP | 1 335 229 A | 8/2003 |
| WO | WO 2006/037651 | 4/2006 |
| WO | WO 2006/069725 | 7/2006 |
| WO | WO 2008/043433 | 4/2008 |

OTHER PUBLICATIONS

Chinese Office Action, with English translation, issued Nov. 27, 2012 in corresponding Chinese Application No. 200980135379.4.

German Examination Report for corresponding Appl No. 10 2008 046 699.9-51, with English translation, dated Jun. 18, 2009.

International Search Report and Written Opinion for the corresponding PCT Application No. PCT/EP2009/006171, filed Feb. 8, 2010.

Chinese Office Action, with translation thereof, for CN Appl No. 200980135379.4, dated Jan. 24, 2014.

* cited by examiner

MICROLITHOGRAPHIC IMAGING OPTICAL SYSTEM INCLUDING MULTIPLE MIRRORS

CROSS-REFERENCE TO RELATED APPLICATIONS

This application is a continuation of, and claims benefit under 35 USC 120 to, international application PCT/EP2009/006171, filed Aug. 26, 2009, which claims benefit of German Application No. 10 2008 046 699.9, filed Sep. 10, 2008 and U.S. Ser. No. 61/095,689, filed Sep. 10, 2008. International application PCT/EP2009/006171 is hereby incorporated by reference in its entirety.

FIELD

The disclosure relates to an imaging optical system with a plurality of mirrors, which image an object field in an object plane into an image field in an image plane.

BACKGROUND

Imaging optical systems of this type are known from EP 1 093 021 A2 and WO 2006/069725 A1. Further imaging optical systems are known from US 2007/0035814 A1, U.S. Pat. No. 7,186,983 B2, US 2007/0233112 A1 and WO 2006/037 651 A1. An imaging optical system is known from U.S. Pat. No. 6,172,825 B1, in which the position of an entry pupil plane of the imaging optical systems is produced from the position for an aperture diaphragm or stop AS.

SUMMARY

The disclosure provides illumination system including an imaging optical system in which the transmission losses of the illumination system are relatively low.

In some embodiments, an imaging optical system has a beam path, an object plane, an image plane and an entry pupil. The imaging optical system also has a connecting axis, which is perpendicular to the object plane and runs through the geometric centre point of the mirror which is most closely adjacent to the object field. The mirror which is most closely adjacent to the object field is arranged at a spacing from the object field which is greater than a spacing of an entry pupil plane of the imaging optical system from the object field. The pupil plane lies in the beam path of the imaging light up-stream of the object field.

The imaging optical system includes a plurality of mirrors that image an object field in an object plane into an image field in the image plane along the beam path. A connecting axis is perpendicular to the object plane and runs through the geometric centre point of the mirror which is most closely adjacent to the object field. The distance between the object field and the mirror which is most closely adjacent to the object field is greater than the distance between the object field and the entry pupil plane. The entry pupil plane lies in the beam path up-stream of the object field.

In certain embodiments, an imaging optical system with a plurality of mirrors, which image an object field in an object plane into an image field in an image plane, where:
an entry pupil plane lies in the beam path of the imaging light upstream of the object field,
the imaging light is reflected on the object plane,
a connecting axis is perpendicular to the object plane and runs through the geometric center point of the entry pupil,
an intersection point of the connecting axis with the entry pupil plane is closer to the object plane than a first intersection point in the beam path of the imaging light downstream of the object field, of a main beam of a central object field point with the connecting axis,
at least one of the mirrors has a through-opening for imaging light to pass through.

In an imaging optical system of this type, when using a reflecting object to be imaged, an optical component may be arranged in the beam path upstream of the object field on the connecting axis. As a result, the number of components used to illuminate the object field, of an optical illumination system arranged in the beam path upstream of the imaging optical system can be reduced, so the total losses of illumination light are reduced. The disclosure also provides to develop an imaging optical system of the type mentioned at the outset in such a way that deformations of a mirror adjacent to a field have effects, which are as small as possible, on the imaging behaviour of the imaging optical system.

This can be achieved according to the disclosure by an imaging optical system of the type mentioned at the outset, the imaging optical system, spaced apart from a first mirror, which is most closely adjacent to one of the two fields and is called the neighboring mirror, having a deformable further mirror, which is arranged in a plane, which is optically conjugated to an arrangement plane of the neighboring mirror in the imaging optical system. Examples of planes optically conjugated with respect to one another of an imaging optical system are the field planes of the imaging optical system or the pupil planes of the imaging optical system. All planes, which correspond to one another with regard to the bundle form and the angle distribution of the imaging beams, are planes which are optically conjugated with respect to one another.

According to the disclosure, it was recognized that a deformable mirror in an optically conjugated plane with respect to the neighboring mirror, the deformation of which brings about undesired changes in the properties of the imaging optical system, leads to good compensation of changes in the imaging properties caused because of the deformation. In this case, deformations of the neighboring mirror, which may have various causes, can be compensated. Deformations of the neighboring mirror because of its inherent weight, in other words gravitative deformations, may be compensated. Deformations of the neighboring mirror can also be compensated by the further mirror arranged in the optically conjugated plane, these being produced by oscillations of the neighboring mirror. In this case, the deformable mirror may be equipped with actuating elements, which allow a deformation which is synchronised with the oscillations of the neighboring mirror. The deformable mirror may, for example, be actuatable at a bandwidth corresponding to the bandwidth of the oscillation of the neighboring mirror. An example of actuating elements which can be used for this in the deformable mirror is described in U.S. Pat. No. 7,443,619 B2. The actuating elements disclosed there, which are used for the deformation of the reflection surface of a mirror, may be operated at a bandwidth, which is so high that compensation of deformations induced by oscillation in the neighboring mirror is thereby possible. In particular, Lorentz actuators may be used. Thermal deformations of the neighboring mirror may also be compensated with the aid of the deformable mirror arranged in the optically conjugated plane.

A further object of the present disclosure is to develop an imaging optical system of the type mentioned at the outset in such a way that a spacing, which is as small as possible, of a reflection surface of a field-adjacent mirror from the adjacent field is possible.

This object is achieved according to the disclosure by an imaging optical system of the type mentioned at the outset, wherein a support body of a mirror, which is most closely adjacent to one of the two fields, which is also called a neighboring mirror, is made of a material, the modulus of elasticity of which is at least twice as great as the modulus of elasticity of the material of the support body of at least one of the other mirrors.

According to the disclosure, it was recognized that it is certainly possible to use a material with a very high modulus of elasticity in the material selection for the neighboring mirror. This allows the neighboring mirror to be equipped with a very thin support body, which can be brought correspondingly closely to the field. Because of the high modulus of elasticity of the material of the support body of the neighboring mirror, the latter, despite the optionally very thin support body, has adequate stability. The support bodies of the other mirrors, which may be thicker, in other words less thin, may, on the other hand, be made of a material with a lower modulus of elasticity. The material selection for these other mirrors may therefore take place from other points of view. These other mirrors may all be manufactured from the same material; this is however not imperative. The modulus of elasticity of the neighboring mirror may be at least twice as great as the greatest modulus of elasticity of the material of the support bodies of all the other mirrors. The comparative material, with which the material of the neighboring mirror is compared with respect to the modulus of elasticity, is then the material of the other mirror with the greatest modulus of elasticity. When using the imaging optical system as a projection lens system for transmitting a structure arranged in the object field into the image field, the neighboring mirror is most closely adjacent to the image field of the imaging optical system. Another application of the imaging optical system is a microscope lens system. In this case, the neighboring mirror is most closely adjacent to the object field of the imaging optical system. Generally, the neighboring mirror is most closely adjacent to the field on the high-aperture side of the imaging optical system. No other mirror of the imaging optical system thus has a smaller spacing from this field.

The features of the imaging optical systems according to the disclosure described above may also be implemented in combination.

The neighboring mirror may be manufactured from a material with a modulus of elasticity which is at least 150 GPa. A modulus of elasticity of this type allows a very thin design of the support body of the neighboring mirror. The support body of the neighboring mirror is preferably made of a material with a modulus of elasticity which is at least 200 GPa, more preferably at least 250 GPa, more preferably 300 GPa, more preferably 350 GPa and still more preferably 400 GPa.

The support body of the neighboring mirror may also be manufactured from silicon carbide. This material, for example, allows production of a very thin support body via a forming method by a graphite forming body. The support body can then be still further processed using known surface processing methods, if this becomes desirable to achieve the optical imaging quality. Alternative materials for the support body of the neighboring mirror are SiSiC, CSiC and SiN.

The imaging optical system, spaced apart from the neighboring mirror, may have a deformable mirror. With the aid of a deformable mirror of this type, a compensation of thermal deformations of the neighboring mirror is possible, which may, for example, come from a thermal loading of the neighboring mirror by residual absorption of the imaging light.

The deformable mirror may be arranged in an optical plane which is conjugated with respect to the arrangement plane of the neighboring mirror in the imaging optical system. This simplifies the compensation of thermal deformations of the neighboring mirror by a compensating deformation of the deformable mirror, as measured deformations of the neighboring mirror can easily be converted into compensating deformations of the deformable mirror. In this case, it is sufficient to make a single mirror of the imaging optical system deformable to compensate thermal deformations of the neighboring mirror. Alternatively, it is naturally also possible to make a plurality of mirrors of the imaging optical system deformable in a targeted manner.

The mirrors, which the imaging optical system has in addition to the neighboring mirror, may be constructed from a material with a thermal expansion coefficient, which is at most $1 \times 10^{-7}$ m/m/K. Examples of materials of this type are Zerodur® and ULE®. A thermal load on mirrors made of these materials practically does not lead to any or only very slight deformation of the reflection surfaces thereof.

If the imaging optical system has precisely six mirrors, this allows a simultaneously compact and, with regard to its imaging errors, well corrected imaging optical system.

A reflection surface of at least one mirror of the imaging optical system may be designed as a surface which can be described by a rotationally symmetrical asphere. As a result, good imaging error correction is made possible.

A reflection surface of at least one mirror of the imaging optical system may be designed as a freeform surface which cannot be described by a rotationally symmetrical function. The use of freeform surfaces instead of reflection surfaces having a rotationally symmetrical axis provides new degrees of design freedom, which leads to imaging optical systems with feature combinations which could not be realised with rotationally symmetrical reflection surfaces. Freeform surfaces suitable for use in imaging optical systems according to the disclosure are known from US 2007/0058269 A1 and US 2008/0170310 A1. At least one of the mirrors of the imaging optical system may have a through-opening for imaging light to pass through. This allows the design of the imaging optical system with a very large numerical aperture. When using the imaging optical system as a projection lens systems, a very high structure resolution at the given wavelength of the imaging light may thus be achieved.

The advantages of a projection exposure system with an imaging optical system according to the disclosure, a light source for the illumination and imaging light and with an illumination optical system for guiding the illumination light to the object field of the imaging optical system, and in particular the advantages of a projection exposure system, in which a pupil facet mirror of the optical illumination system is arranged in an entry pupil plane of the imaging optical system, correspond to those, which were stated above in relation to the imaging optical system according to the disclosure. In an arrangement of the pupil facet mirror in the entry pupil plane of the imaging optical system, the pupil facet mirror can direct the illumination and imaging light directly to the object field. Optical components lying in between, between the pupil facet mirror and the object field are not then necessary and this increases the transmission of the projection exposure system. This is advantageous, in particular, when the illumination and imaging light can generally only be guided with losses, which is the case, for example, in EUV wavelengths in the range between 5 nm and 30 nm. If the imaging optical system according to the disclosure is designed such that, on a connecting axis, which is perpendicular to the object plane and runs through the geometric center point of the mirror, which is most closely adjacent to the object field, the mirror most closely adjacent to the object field is arranged at a spacing, which is greater than a spacing of an entry pupil plane located in the beam path of the imaging light upstream of the object field, of the imaging optical system from the object field, when using a reflecting object to be imaged, the pupil facet mirror arranged in the entry pupil plane can be accommodated on the connecting axis and therefore compactly between other components of the imaging optical system. The same applies when the imaging optical system according to the disclosure is designed such that an intersection point of a connecting axis, which is perpendicular to the object plane and runs through the geometric center point of the entry pupil, with the entry pupil plane, lies closer to the object plane than a first intersection point lying in the beam bath of the imaging light after the object field of a main beam, of a central object field point with the connecting axis. It is to be noted here that because of the fact that the beam path of the illumination or imaging light is reflected on the object plane, the entry pupil plane, although it lies in the beam path upstream of the object plane, comes to rest on the side of the object plane facing the image plane and generally between the object plane and the image plane.

The light source of the projection exposure system may be wideband and, for example, have a bandwidth, which is greater than 1 nm, which is greater than 10 nm or which is greater than 100 nm. In addition, the projection exposure system may be designed such that it can be operated by light sources of different wavelengths. An optical illumination system with a pupil facet mirror is, for example, known from US2007/0223112 A1.

Corresponding advantages, as stated above, apply to a method for producing a microstructured component having the following method steps:
providing a reticle and a wafer,
projecting a structure on the reticle onto a light-sensitive layer of the wafer with the aid of the projection exposure system according to the disclosure,
producing a microstructure on the wafer,
and the microstructured or nanostructured component produced thereby.

BRIEF DESCRIPTION OF THE DRAWINGS

Embodiments will be described in more detail below with the aid of the drawings, in which.

DETAILED DESCRIPTION

Figure 1:
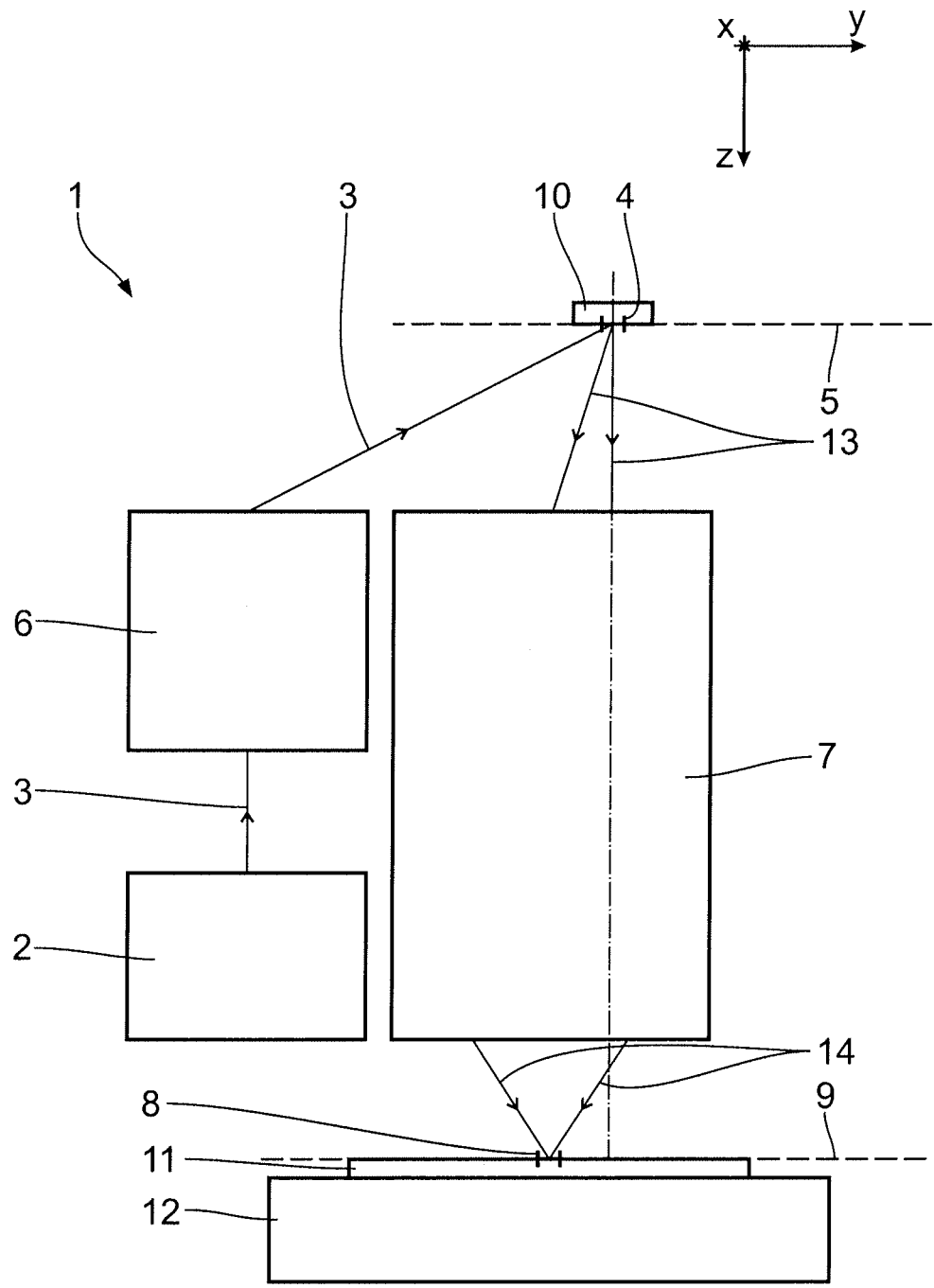
FIG. 1 schematically shows a projection exposure system for microlithography.

A projection exposure system 1 for microlithography has a light source 2 for illumination light. The light source 2 is an EUV light source, which generates light in a wavelength range of between 5 nm and 30 nm. Other EUV wavelengths are also possible. Generally any wavelengths, for example visible wavelengths are even possible for the illumination light guided in the projection exposure system 1. A beam path of the illumination light 3 is shown very schematically in FIG. 1.

An optical illumination system 6 is used to guide the illumination light 3 to an object field 4 in an object plane 5. The object field 4 in an image field 8 in an image plane 9 is imaged at a predetermined reduction scale by an optical projection system 7. The optical projection system 7 reduces by a factor of 8.

Other imaging scales are also possible, for example 4×, 5×, 6× or else imaging scales, which are greater than 8×. For illumination light with EUV wavelengths, an imaging scale of 8× is suitable in particular, as the angle of incidence on the object side can thus be kept small on a reflection mask. Illumination angles on the object side of less than 6° can be realised for an image-side aperture of the optical projection system 7 of NA=0.5, with an imaging scale of 8×. The image plane 9 is arranged in the optical projection system 7 parallel to the object plane 5. A section coinciding with the object field 4, of a reflecting mask 10, which is also called a reticle, is imaged here. Because of the reflecting effect of the reticle 10, the illumination light 3 is reflected on the object plane 5. The imaging takes place on the surface of a substrate 11 in the form of a wafer, which is carried by a substrate holder 12. FIG. 1 schematically shows between the reticle 10 and the optical projection system 7, a beam bundle 13 of the illumination light 3 running into the latter and, between the optical projection system 7 and the substrate 11, a beam bundle 14 of the illumination light 3 running out of the optical projection system 7. The image field-side numerical aperture NA of the optical projection system 7 according to FIG. 2 is 0.50.

To facilitate the description of the projection exposure system 1, a Cartesian xyz coordinate system is given in the drawing, from which the respective position relationship of the components shown in the figures emerges. In FIG. 1, the x-direction runs perpendicularly to the plane of the drawing into the latter, and the y-direction runs to the right and the z-direction runs downwardly.

The projection exposure system 1 is of the scanner type. Both the reticle 10 and the substrate 11 are scanned during operation of the projection exposure system 1 in the y-direction.

Figure 2:
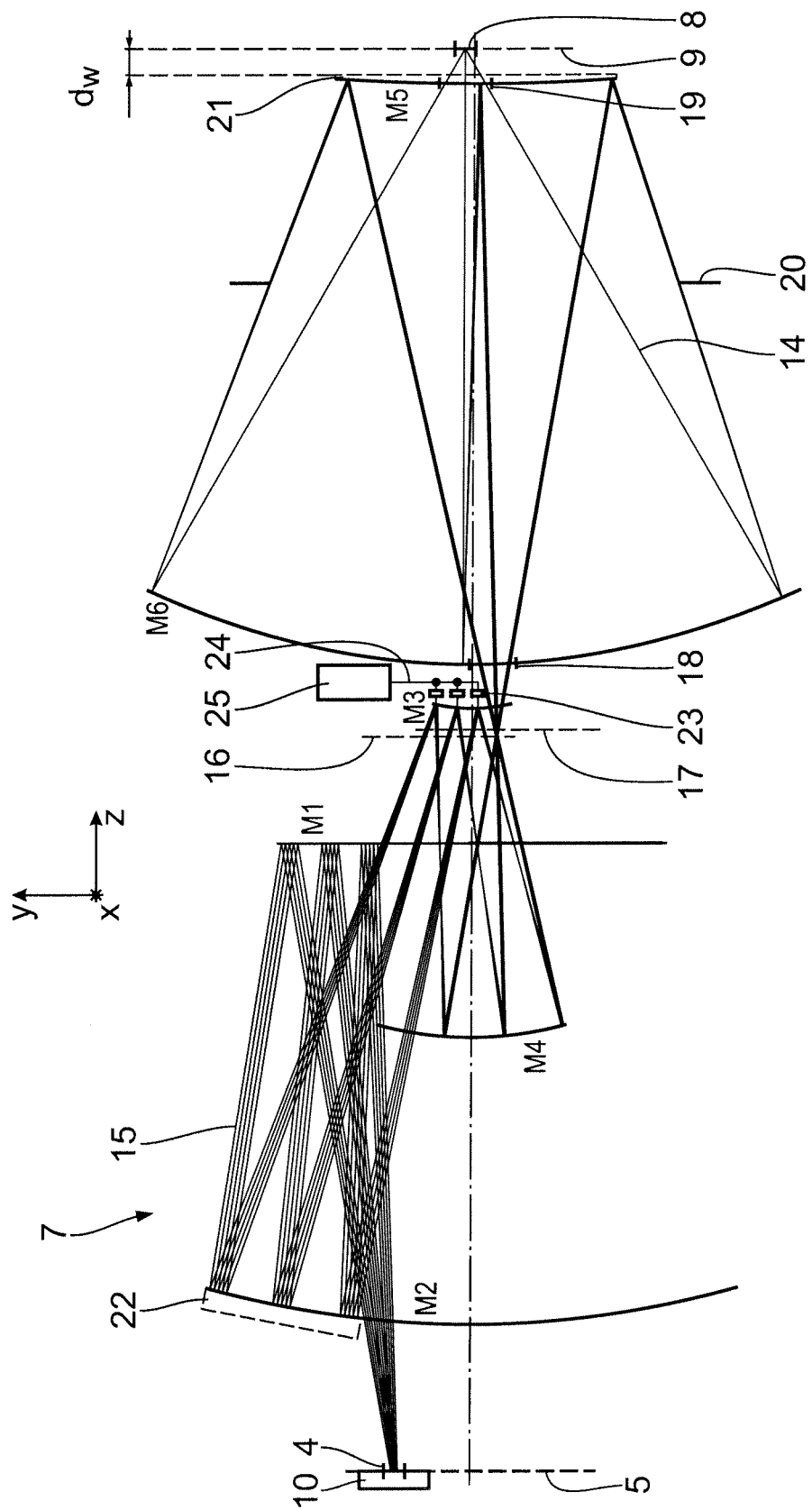
FIG. 2 shows a meridianal section which contains imaging beam paths of field points spaced apart from one another, through an embodiment of an optical projection system of the projection exposure system according to FIG. 1.

FIG. 2 shows the optical design of the optical projection system 7. The beam path is shown, in each case, of three individual beams 15, which emanate from five object field points lying one above the other in FIG. 2 and spaced apart from one another in the y-direction, the three individual beams 15, which belong to one of these five object field points, being associated in each case with three different illumination directions for the five object field points. These three illumination directions are depicted by the upper coma beam, the lower coma beam and the main beam of each of the five object field points.

Proceeding from the object plane 5, the individual beams 15 are firstly reflected by a first mirror M1 and then by further mirrors, which are designated below, in the order of the beam path, mirror M2, M3, M4, M5 and M6. In each case, the mathematical parent surfaces used to calculate the form of the reflection surfaces of the mirrors M1 to M6 are shown. In the actual optical projection system 7, the reflection surfaces of the mirrors M1 to M6 are actually only present where they are impinged upon by the individual beams 15.

The optical projection system 7 according to FIG. 2 thus has six reflecting mirrors. These mirrors bear a highly reflective coating for the wavelength of the illumination light 3, if this is desirable because of the wavelength, for example in the EUV. In particular, the mirrors M1 to M6 have multi-reflection coatings to optimise their reflection for the impinging illumination light 3. The reflection is, in particular, when EUV illumination light 3 is used, all the better, the closer the reflection angle, in other words the angle of impingement of the individual beams 15 on the surfaces of the mirrors M1 to M6, to the perpendicular incidence. The optical projection system 7 overall has small reflection angles for all the individual beams 15.

Radiations with very different wavelengths from one another can also be guided in the optical illumination system 6 and the optical projection system 7, as these optical systems have substantially achromatic properties. It is thus possible, for example, to guide an adjustment laser or an auto focusing system in these optical systems, a wavelength which is very different from the working wavelength thereof being simultaneously worked with for the illumination light. Thus, an adjusting laser may work at 632.8 nm, at 248 nm or at 193 nm, while illumination light in the range between 5 and 30 nm is simultaneously worked with.

The mirror M3 has a convex basic shape. In other words, the mirror M3 can be described by a convex best adapted surface. In the following description, mirrors of this type are designated, in a simplified manner, convex. Mirrors which can be described by a concavely best adapted surface, are designated, in a simplified manner, concave. The convex mirror M3 ensures a good Petzval correction in the optical projection system 7.

An overall length of the optical projection system 7, in other words the spacing between the object plane 5 and the image plane 9, is 1521 mm in the optical projection system 7. The individual beams 15 belonging to a specific illumination direction of the five object field points combine in a pupil plane 16 of the optical projection system 7. The pupil plane 16 is arranged adjacent to the mirror M3 in the beam path thereafter.

The mirrors M1 to M4 image the object plane 5 in an intermediate image plane 17. The intermediate image-side numerical aperture of the optical projection system 7 is about 0.2. The mirrors M1 to M4 form a first part imaging optical system of the optical projection system 7 with a reducing imaging scale of about 3.2×. The following mirrors M5 and M6 form a further part imaging optical system of the optical projection system 7 with a reducing imaging scale of about 2.5×. Formed in the beam path of the illumination light 3 between the mirrors M4 and M5 upstream of the intermediate image plane 7 and adjacent thereto is a through-opening 18 in the mirror M6, through which the illumination or imaging light 3 passes upon the reflection from the fourth mirror M4 to the fifth mirror M5. The fifth mirror M5 in turn has a central through-opening 19, through which the beam bundle 14 passes between the sixth mirror M6 and the image plane 9.

In the beam path between the fifth mirror M5 and the sixth mirror M6 is a further pupil plane 20 of the optical projection system 7, which is optically conjugated to the first pupil plane 16. At the site of the further pupil plane 20 there exists a diaphragm plane which is physically accessible from the outside. An aperture diaphragm may be arranged in this diaphragm plane.

The optical projection system 7, in one of the pupil planes 16, 20, has an obscuration diaphragm or stop arranged in a centered manner. As a result, the part beams of the projection beam path associated with the central through-openings 18, 19 in the mirrors M6, M5 are obscured. Therefore, the design of the optical projection system 7 is also called a design with a central pupil obscuration.

A distinguished individual beam 15, which connects a central object field point with a centrally illuminated point in the entry pupil of the optical projection system 7 is also called a main beam of a central field points. The main beam of the central field point, from the reflection at the sixth mirror M6, with the image plane 9, approximately encloses a right angle, in other words, runs approximately parallel to the z-axis of the projection exposure system 1. This angle is greater than 85°.

The image field 8 has the shape of a ring field segment, in other words is delimited by two part circles running parallel to one another and two side edges also running parallel to one another. These side edges run in the y-direction. Parallel to the x-direction, the image field 8 has an extent of 13 mm. Parallel to the y-direction, the image field 8 has an extent of 1 mm. The radius R of the through-opening 19 satisfies the following relation for a vignetting-free guidance.

$$R \geq \frac{1}{2} \cdot D + d_w \cdot NA$$

D is the diagonal here of the image field 8. $d_w$ is a free working spacing of the mirror M5 from the image plane 9. This free working spacing is defined as the spacing between the image plane 9 and the section located closest thereto of a used reflection surface of the closest mirror of the optical projection system 7, in other words, in the embodiment according to FIG. 2 of the mirror M5, NA is the image-side numerical aperture. The free working spacing $d_w$ in the optical projection system 7 is 39 mm.

The fifth mirror M5 is the mirror which is most closely adjacent to the object field 5 in the image plane 9. The fifth mirror M5 is therefore also called the neighboring mirror below. The neighboring mirror M5 has a support body 21 which is indicated by dashed lines in FIG. 2, on which the reflection surface of the neighboring mirror M5 is formed. The support body 21 is made of silicon carbide. This material has a modulus of elasticity (Young's modulus) of 400 GPa. The other mirrors M1 to M4 and M6 of the optical projection system 7 are made of Zerodur®. This material has a modulus of elasticity of 90 GPa.

The modulus of elasticity of the support body 21 of the neighboring mirror M5 is thus more than twice as great as the modulus of elasticity of the material for the support body 22 of the other mirrors M1 to M4 and M6.

The support body 21 has a maximum thickness of 35 mm, so a free working spacing of 4 mm remains between a rear of the mirror M5 remote from the reflection surface of the mirror M5, and the image plane. A maximum diameter of the reflection surface used of the mirror M5 in the optical projection system 7 is 285 mm. A ratio between this maximum diameter and the thickness of the support body 21 of the mirror M5 is therefore 285/35=8.14. Other ratios of this type, which will also be called aspect ratios below are possible in the range between 6 and 20.

The support body 21 of the neighboring mirror M5 may also be made from a different material with a modulus of elasticity which is at least 150 GPa. Examples of materials of this type are reaction-bound silicon-infiltrated silicon carbide (SiSiC) with a modulus of elasticity of 395 GPa, carbon fibre-reinforced silicon carbide (CSiC) with a modulus of elasticity of 235 GPa and silicon nitride (SiN) with a modulus of elasticity of 294 GPa. Zerodur®, has, in the room temperature range of interest, a thermal expansion coefficient of less than $50 \times 10^{-9}$ m/m/K. The support bodies 22 of the mirrors M1 to M4 and M6 may also be constructed from a different material with a thermal expansion coefficient, which is at most $1 \times 10^{-7}$ m/m/K. A further example of a material of this type is ULE® with a thermal expansion coefficient, which, in the room temperature range of interest, is also less than $50 \times 10^{-9}$ m/m/K, and which has a modulus of elasticity of 69 GPa.

The thermal expansion coefficient of the material of the support body 21 of the neighboring mirror M5 is significantly greater than the thermal expansion coefficient of the support bodies 22 of the other mirrors of the optical projection system 7. SiC, for example, has a thermal expansion coefficient in the room temperature range of interest of $2.6 \times 10^{-6}$ m/m/K. The thermal expansion coefficients of the other material variants for the support body 21 of the neighboring mirror M5 vary in a range between $1 \times 10^{-6}$ m/m/K and $2.6 \times 10^{-6}$ m/m/K.

The neighboring mirror M5 is in an arrangement plane in the imaging beam path of the optical projection system 7, which is optically conjugated to an arrangement plane, in which the third mirror M3 lies. The mirror M4 lying in between in the imaging beams path thus acts such that it approximately images these two arrangement planes of the mirrors M3 and M5 in one another.

The third mirror M3 is designed as a deformable mirror. The reflection surface of the third mirror M3 is, in one embodiment of the deformable mirror, connected at the rear to a plurality of actuators 23 acting perpendicularly to the reflection surface, which are connected by signal lines or a signal bus 24 to a control device 25. By individual activation of the actuators 23 by the control device 25, the form of the reflection surface of the mirror M3 can be input.

As the mirror M3 is arranged in a position optically conjugated to the position of the neighboring mirror M5, deformations of the reflection surface of the neighboring mirror M5 caused, for example, because of a thermal expansion of the support body 21 of the neighboring mirror M5 can be compensated by deformations in the opposite direction of the reflection surface of the third mirror M3, input by the control mechanism 25. A deformation of the reflection surface of the neighboring mirror M5 may be detected optically, for example. Corresponding detection methods are known. The result of this detection of deformation can then be used as an input signal for the control device 25 to determine control values for the individual actuators 23.

In this manner, thermal drifts, in particular caused by the different thermal expansion coefficients of the materials of the support body 21, on the one hand, and of the support bodies 22, on the other hand, can be compensated by a deformation of the reflection surface of the third mirror M3. A targeted deformation of the reflection surface of the third mirror M3 can naturally also be used to correct or compensate further imaging errors, for example for Petzval correction.

The reflection surface of the third mirror M3 may be designed as a closed reflection surface, sections of this closed reflection surface in each case being mechanically connected to an individual actuator 23. It is alternatively possible to equip the third mirror M3 with a reflection surface made of a plurality of mirror sections which can be moved separately from one another, for example as a multi-mirror array or a facet mirror. Each of these mirror sections can then be tilted or displaced individually by their own actuator 23, so a deformation of the reflection surface of the third mirror M3 formed by the totality of the mirror sections is thus brought about. A deformation of the mirror surface of a mirror, which has a highly reflective coating is also possible by the use of an electronically activatable piezo-electric layer, which may, for example, be arranged between the mirror substrate and the highly reflective coating.

It is possible to use as actuators to deform the third mirror M3 or to deform one of the mirror sections of the third mirror M3, actuators which are described, for example, in U.S. Pat. No. 7,443,619. Lorentz actuators, in particular, can be used. The actuating elements of the third mirror M3 can be activated at a high band width. This makes it possible to also compensate deformation imaging influences caused by oscillations or vibrations of the neighboring mirror M5 via the deformable mirror M3. The deformations of the deformable mirror M3 are then synchronised with the oscillation deformations of the neighboring mirror M5. This can be realised by a corresponding sensory scanning or sampling of the oscillations of the mirror M5 and activation derived therefrom of the actuating elements for the deformable mirror M3.

The reflection surfaces of the mirrors M1 to M6 have rotationally symmetrical aspherical basic shapes, which can be described by known asphere equations. Alternatively, it is possible to design at least individual ones of the mirrors M1 to M6 as freeform surfaces which cannot be described by a rotationally symmetrical function. Freeform surfaces of this type for reflection surfaces of mirrors of optical projection systems of projection exposure systems for microlithography are known from US 2007/0058269 A1 and US 2008/0170310 A1.

The support body 21 of the neighboring mirror M5 can be produced by a CVD (chemical vapour deposition) method. Here, silicon carbide from the gas phase is deposited on a forming body made of graphite. The forming body in this case has a shape corresponding to the desired reflection surface. After the separation of the support body 21 from the forming body, another coating of the support body 21 can be carried out to improve the processability and the reflectivity of the reflection surface of the support body 21.

As an alternative to a configuration made of a material with a modulus of elasticity, which is at least twice as great as that of one of the other mirrors, the neighboring mirror M5 may also be made of Zerodur® or of ULE® (Ultra Low Expansion) glass. A titanium silicate glass may be used here, for example. Deformations of the neighboring mirror M5 and the effects thereof on the imaging properties of the imaging optical system 7 may be compensated via the deformable third mirror M3.

Figure 3:
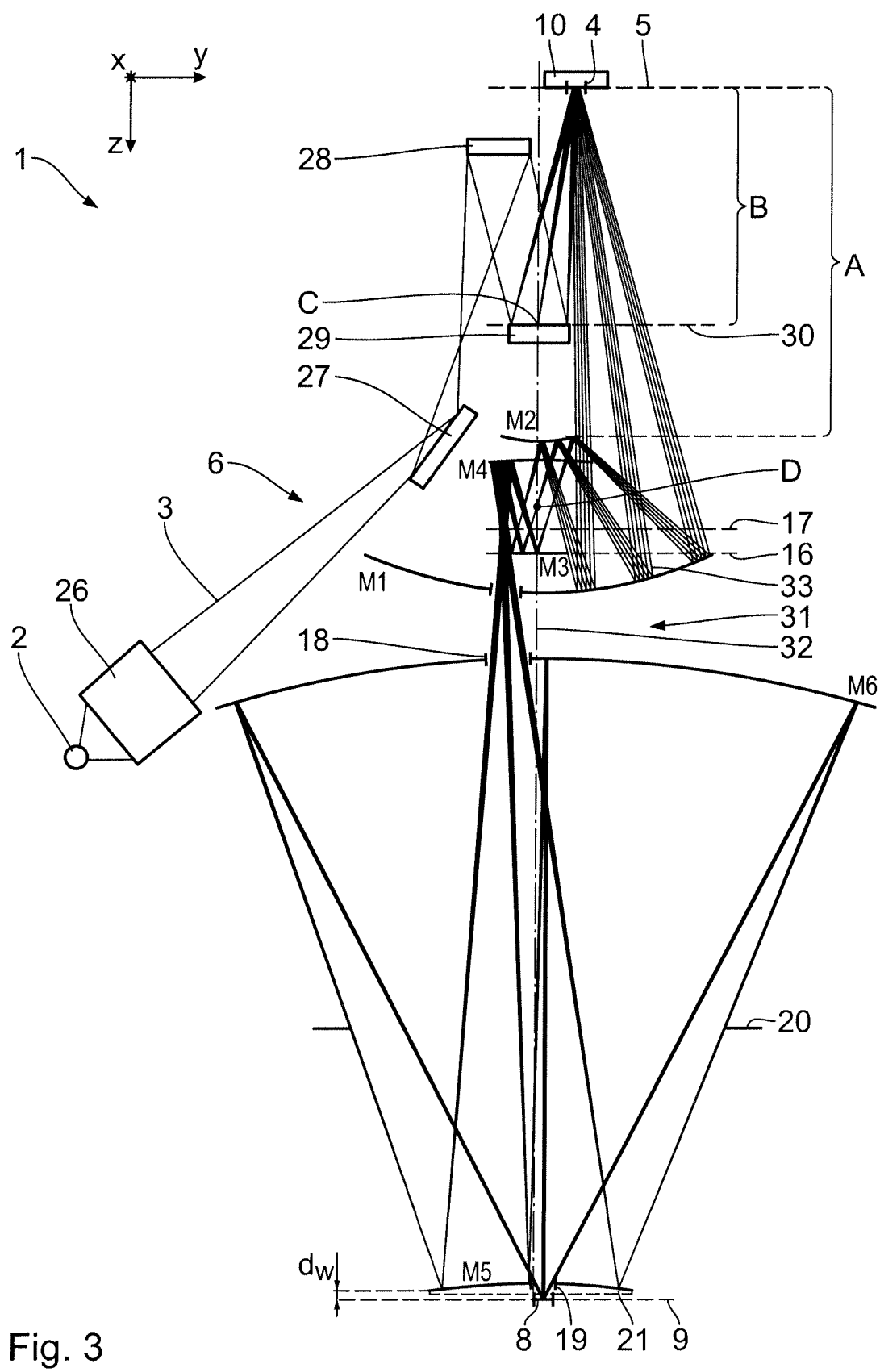
FIG. 3 schematically shows a beam path supplemented by an illumination system of the projection exposure system in a projection exposure system with a further embodiment of an optical projection system.

FIG. 3 schematically shows a further embodiment of a projection exposure system 1. Components, which correspond to those which were described above with reference to FIGS. 1 and 2, have the same reference numerals and are not discussed again in detail.

A collector 26 for collecting the usable emission of the light source 2 is arranged down-stream of the light source 2. Arranged downstream of the collector 26 is in turn a spectral filter 27, which is operated in grazing incidence. A field facet mirror 28 is arranged downstream of the spectral filter 27. A pupil facet mirror 29 is arranged downstream of the field facet mirror 28. The concept of facet mirrors 28, 29 of this type as components of the optical illumination system 6 is basically known, for example, from U.S. Pat. No. 7,186,983 B2.

The pupil facet mirror 29 is arranged in the region of an entry pupil plane 30 of an optical projection system 31, which can be used as an alternative to the optical projection system 7 in the projection exposure system 1. The illumination light 3 is directed by the pupil facet mirror 29 directly to the reflective reticle 10. No further component influencing or deflecting the illumination light 3, for example a mirror with a grazing incidence is present between the pupil facet mirror 29 and the reticle 10.

The optical projection system 31 is only described below where it qualitatively differs from the optical projection system 7 according to FIGS. 1 and 2.

In the optical projection system 31, the first pupil plane 16 after the object plane 5 lies between the second mirror M2 and the third mirror M3. At this point, an aperture diaphragm, for example, may be arranged to limit the illumination light beam bundle.

The pupil facet mirror 29 and the second mirror M2 of the optical projection system 31 are arranged on a connecting axis 32. This connecting axis is defined as the axis passing through the geometric center point of the mirror most closely adjacent to the object plane 5 and perpendicular to the object plane 5. In the embodiment according to FIG. 3, the mirror M2 is the mirror which is most closely adjacent to the object plane 5. The second mirror M2 is therefore the mirror, which is most closely adjacent to the object field 4 along the connecting axis 32, of the optical projection system 31. The second mirror M2 is arranged along the connecting axis 32 at a spacing A from the object plane 5, which is greater than a spacing B of the entry pupil plane 30 from the object plane 5. The spacing A is 704 mm. The spacing B is 472 mm. The pupil facet mirror 29 and the second mirror M2 of the optical projection system 31 are arranged back to back. Therefore, the optical projection system 31 provides construction space for accommodating the pupil facet mirror 29 on the connecting axis 32. The pupil facet mirror 29 can thus be arranged in such a way that the illumination light 3 from the pupil facet mirror 29 is reflected directly to the reflecting reticle 10.

The connecting axis 32 is also perpendicular to the image plane 9. The connecting axis 32 also runs through the geometric center point of the mirror M5, which is most closely adjacent to the image field 8. An intersection point C of the connecting axis 32 with the entry pupil plane 30 lies closer to the object plane 5 than a first intersection point D in the beam path of the illumination and imaging light 3 of a main beam 33 of a central object field point with the connecting axis 32. Because of the reflecting action of the reticle 10, the entry pupil plane, despite the fact that it is arranged in the beam path upstream of the object plane 5, lies between the object plane 5 and the image plane 9. Because of the fact that the spacing of the intersection point C from the object plane 5 is smaller than the spacing of the intersection point D from the object plane 5, the possibility is produced of moving the pupil facet mirror 29 into the construction space of the optical projection system 31, without an illumination beam path of the illumination light 3 being obstructed by components of the optical projection system 31 and without an imaging beam path of the illumination light 3 being obstructed by the pupil facet mirror 29.

In contrast to the optical projection system 7, in the optical projection system 31, the spacing of the mirror M3 from the object plane 5 is less than the spacing of the mirror M1 from the object plane 5.

The optical projection system 31 has an image-side numerical aperture NA of 0.4. The object field 4, in the optical projection system 31, has an extent of 2 mm in the y-direction and 26 mm in the x-direction. The reduced imaging scale of the optical projection system 31 is 4×.

The optical data of the optical projection system 31 are reproduced below with the aid of two tables in the Code V®-format.

The first table in the "radius" column in each case shows the radius of curvature of the mirrors M1 to M6. The third column (thickness) describes the spacing, proceeding from the object plane 5, in each case from the following surface in the z-direction.

The second table describes the precise surface form of the reflection surfaces of the mirrors M1 to M6, the constants K and A to G being inserted in the following equation for the arrow height z:

$$z(h) == \frac{ch^2}{1 + SQRT\{1 - (1+K)c^2h^2\}} + +Ah^4 + Bh^6 + Ch^8 + Dh^{10} + Eh^{12} + Fh^{14} + Gh^{16}$$

h is the spacing here from an optical axis of the optical projection system 31. Thus $h^2 = x^2 = y^2$ applies. For c, the reciprocal value of "radius" is used.

| Surface | Radius | Thickness | Operating mode |
| --- | --- | --- | --- |
| Object plane | Infinite | 1008.515 | |
| M1 | −589.188 | −304.940 | REFL |
| M2 | −241.133 | 226.892 | REFL |
| M3 | −1530.294 | −188.411 | REFL |
| M4 | 557.639 | 1651.258 | REFL |
| M5 | 1500.000 | −509.557 | REFL |
| Stop | Infinite | −745.289 | |
| M6 | 1483.965 | 1284.846 | REFL |
| Image plane | Infinite | 0.000 | |

| Surface | K | A | B | C |
| --- | --- | --- | --- | --- |
| M1 | −1.907467E−01 | −4.201365E−14 | −1.850017E−17 | −2.806339E−22 |
| M2 | −5.642091E−01 | 1.123646E−08 | −1.729255E−13 | 4.634573E−18 |
| M3 | −1.457717E−02 | 6.326755E−09 | 1.214295E−13 | 7.108126E−18 |
| M4 | 3.218346E−03 | 3.917441E−09 | 1.354421E−13 | −2.254336E−17 |
| M5 | 1.035722E+00 | 4.337345E−10 | 9.699608E−16 | 5.753846E−21 |
| M6 | 1.041374E−01 | −7.896075E−13 | −1.157231E−19 | −3.023015E−25 |

| Surface | D | E | F | G |
| --- | --- | --- | --- | --- |
| M1 | 4.451266E−27 | −5.566664E−32 | 3.449801E−37 | −8.987817E−43 |
| M2 | 2.211189E−21 | −1.041819E−24 | 1.928886E−28 | −1.341001E−32 |
| M3 | −2.395752E−21 | 8.896309E−31 | 2.012774E−28 | −3.680072E−32 |
| M4 | 2.671995E−21 | −1.455349E−25 | 3.081018E−32 | 2.302996E−34 |
| M5 | −2.106085E−25 | 1.011811E−29 | −2.375920E−34 | 2.279074E−39 |
| M6 | 1.895127E−30 | −6.992363E−36 | 1.347813E−41 | −1.055593E−47 |

An overall length of the optical projection system 31, in other words the spacing between the object plane 5 and the image plane 9, in the optical projection system 31 is 2423 mm. The free working spacing $d_w$ of the mirror M5 from the image plane 9 is 30 mm in the optical projection system 31. The support body 21 has a maximum thickness of 26 mm, so that a free working spacing of 4 mm remains between a rear of the mirror 5 remote from the reflection surface of the mirror M5 and the image plane 9. A maximum diameter of the reflection surface used of the mirror M5 in the optical projection system 31 is 300 mm. A ratio between this maximum diameter and the thickness of the support body 21 of the mirror M5 is therefore 300/26=11.5.

To produce a microstructured or nanostructured component, in particular a semiconductor component for microelectronics, in other words, for example, a microchip, the procedure is as follows: firstly, the reticle 10 and the wafer 11 are provided. Then, a structure present on the reticle 10 is projected onto a light-sensitive layer of the wafer 11 with the aid of the projection exposure system 1. By developing the light-sensitive layer, a microstructure or nanostructure is then produced on the wafer 11.

Corresponding designs of the optical projection system 7, like that according to FIG. 2, may also be used in applications other than projection exposure, for example as a microscope lens system. In this case, the object field 4 and the image field 8 exchange their roles. The mirror M5, in other words, the neighboring mirror, in the case of application of the optical projection system 7 as a microscope lens system, is then most closely adjacent to the object field 8.

What is claimed is:

1. An imaging optical system having an object plane and an image plane, the imaging optical system comprising:
    a plurality of mirrors configured to image an object field in the object plane into an image field in the image plane, wherein:
        the plurality of mirrors comprises a first mirror in a first plane;
        of the plurality of mirrors, the first mirror is most closely adjacent to the object field or the image field;
        the plurality of mirrors comprises a second mirror in a second plane;
        the second plane is optically conjugated to the first plane; and
        the imaging optical system is a microlithographic imaging optical system.

2. The imaging optical system of claim 1, wherein the second mirror is a deformable mirror.

3. The imaging optical system of claim 2, further comprising actuating elements configured to deform the second mirror.

4. The imaging optical system of claim 3, wherein the actuating elements comprise Lorentz actuators.

5. The imaging optical system of claim 2, wherein the imaging optical system comprises a plurality of deformable mirrors.

6. The imaging optical system of claim 2, further comprising a detection device configured to detect a deformation of the first mirror.

7. The imaging optical system of claim 6, further comprising an actuating element configured to deform the second mirror.

8. The imaging optical system of claim of claim 7, further comprising a control device connected with the actuating element so that the actuating element deforms the second mirror based on a signal from the control device.

9. The imaging optical system of claim 8, wherein the detection device is connected with the detection device so that deformation of the second mirror is based on deformation of the first mirror.

10. The imaging optical system of claim 2, wherein the second mirror has a reflection surface without any holes in it.

11. The imaging optical system of claim 2, wherein the second mirror comprises a plurality of mirror sections which are movable independently of each other.

12. The imaging optical system of claim 2, wherein the second mirror comprises a piezo-electric layer.

13. The imaging optical system of claim 1, wherein the imaging optical system comprises precisely six mirrors.

14. The imaging optical system of claim 1, wherein a reflection surface of one of the plurality of mirrors is a rotationally symmetrical asphere.

15. The imaging optical system of claim 1, wherein a reflection surface of one of the plurality of mirrors is a free-form surface which cannot be described by a rotationally symmetrical function.

16. The projection exposure system of claim 1, wherein at least one of the plurality of mirrors has a through-opening through which the beam path passes.

17. A projection exposure system, comprising:
    an imaging optical system according to claim 1; and
    an optical illumination system configured so that, during use of the projection exposure system, the optical illumination system guides illumination light to the object field of the imaging optical system,
    wherein the projection exposure system is a microlithography projection exposure system.

18. The projection exposure system of claim 17, wherein the optical illumination system comprises a pupil facet mirror arranged in the entry pupil plane of the imaging optical system.

19. The projection exposure system of claim 17, wherein the imaging optical system comprises precisely six mirrors.

20. The projection exposure system of claim 17, wherein a reflection surface of one of the plurality of mirrors is a rotationally symmetrical asphere.

21. The projection exposure system of claim 17, wherein a reflection surface of one of the plurality of mirrors is a free-form surface which cannot be described by a rotationally symmetrical function.

22. The projection exposure system of claim 15, wherein at least one of the plurality of mirrors has a through-opening through which the beam path passes.

23. A method, comprising:
    providing a microlithography projection exposure system, comprising:
        an imaging optical system according to claim 1; and
        an optical illumination system configured so that, during use of the projection exposure system, the optical illumination system guides illumination light to the object field of the imaging optical system;
    using the microlithography projection exposure system to project a structure on a reticle onto a light-sensitive layer of the wafer; and
    producing a microstructure on the wafer.

* * * * *

UNITED STATES PATENT AND TRADEMARK OFFICE
CERTIFICATE OF CORRECTION

PATENT NO. : 8,873,122 B2  
APPLICATION NO. : 13/031920  
DATED : October 28, 2014  
INVENTOR(S) : Hans-Juergen Mann, Armin Schoeppach and Johannes Zellner Page 1 of 1

It is certified that error appears in the above-identified patent and that said Letters Patent is hereby corrected as shown below:

In the Claims

Col. 14, line 24, claim 16, delete "projection exposure" and insert -- imaging optical --.

Signed and Sealed this  
Tenth Day of March, 2015

Michelle K. Lee  
*Deputy Director of the United States Patent and Trademark Office*